United States Patent
Moon

(10) Patent No.: US 8,706,792 B1
(45) Date of Patent: Apr. 22, 2014

(54) LOW-COMPLEXITY Q-ARY LDPC DECODER

(75) Inventor: Jaekyun Moon, Daejeon (KR)

(73) Assignee: SK hynix memory solutions inc., San Jose, CA (US)

( * ) Notice: Subject to any disclaimer, the term of this patent is extended or adjusted under 35 U.S.C. 154(b) by 834 days.

(21) Appl. No.: 12/589,633

(22) Filed: Oct. 26, 2009

Related U.S. Application Data

(60) Provisional application No. 61/197,495, filed on Oct. 27, 2008.

(51) Int. Cl.
*G06F 11/00* (2006.01)
*H03M 13/00* (2006.01)

(52) U.S. Cl.
USPC .......................................... 708/531; 714/752

(58) Field of Classification Search
USPC .......................................... 708/531; 714/752
See application file for complete search history.

(56) References Cited

U.S. PATENT DOCUMENTS

| | | | |
|---|---|---|---|
| 7,398,453 B2 * | 7/2008 | Yu | 714/778 |
| 7,453,960 B1 * | 11/2008 | Wu et al. | 375/340 |
| 2008/0276156 A1 | 11/2008 | Gunnam et al. | |
| 2008/0301521 A1 | 12/2008 | Gunnam et al. | |
| 2009/0175388 A1 * | 7/2009 | Chang et al. | 375/341 |
| 2010/0030835 A1 * | 2/2010 | Andreev et al. | 708/531 |

OTHER PUBLICATIONS

Huang et al., "Fast Min-Sum Algorithms for Decoding of LDPC over GF(q)", School of Information Science and Technology, Tsinghua Universtiy, Beijing, P.R. of China, Proceedings of 2006 IEEE Information Theory Workshop.
Voicila et al., "Low-complexity decoding for non-binay LDPC codes in high order fileds", Department of Electrical Engineering University of Hawaii at Manoa Honolulu, Hi, USA, Aug. 8, 2007.

\* cited by examiner

*Primary Examiner* — Chuong D Ngo
(74) *Attorney, Agent, or Firm* — Van Pelt, Yi & James LLP

(57) ABSTRACT

$f(x(s_{k-1}, s_k)) = A(s_{k-1}) + B(s_k)$ is calculated for $n_m^2$ pairs of consecutive state variables $\{s_{k-1}, s_k\}$ using $A(s_k) = \min_{s_{k-1},x}\{A(s_{k-1}) + \Gamma(x_k = x)\}$ and $B(s_k) = \min_{s_{k+1},x}\{B(s_{k+1}) + \Gamma(x_{k+1} = x, s_{k+1})\}$, where $\Gamma(x_k = x)$ is a metric associated with a branch $x_k = x$ connecting consecutive state variables $s_{k-1}$ and $s_k$. The $n_m$ lowest values are selected from the $n_m^2$ calculated values of $f(x(s_{k-1}, s_k)) = A(s_{k-1}) + B(s_k)$ and log likelihood ratios (LLRs) are set to those lowest $f(x(s_{k-1}, s_k))$ values. The $n_m$ values of x that correspond to the $n_m$ lowest values are determined.

15 Claims, 5 Drawing Sheets

LOW-COMPLEXITY Q-ARY LDPC DECODER

CROSS REFERENCE TO OTHER APPLICATIONS

This application claims priority to U.S. Provisional Patent Application No. 61/197,495 entitled LOW-COMPLEXITY Q-ARY LDPC DECODER filed Oct. 27, 2008 which is incorporated herein by reference for all purposes.

BACKGROUND OF THE INVENTION

Decoding a q-ary low density party check (LDPC) codes includes check node processing, which is a bottle-neck in LDPC decoder operation. Check node processing includes setting up a trellis to search for the most likely combinations of the q-ary levels for all symbols involved in a check. It would be desirable to develop new techniques for performing check node processing, at least some embodiments of which reduce or mitigate complexity and/or memory space requirements.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
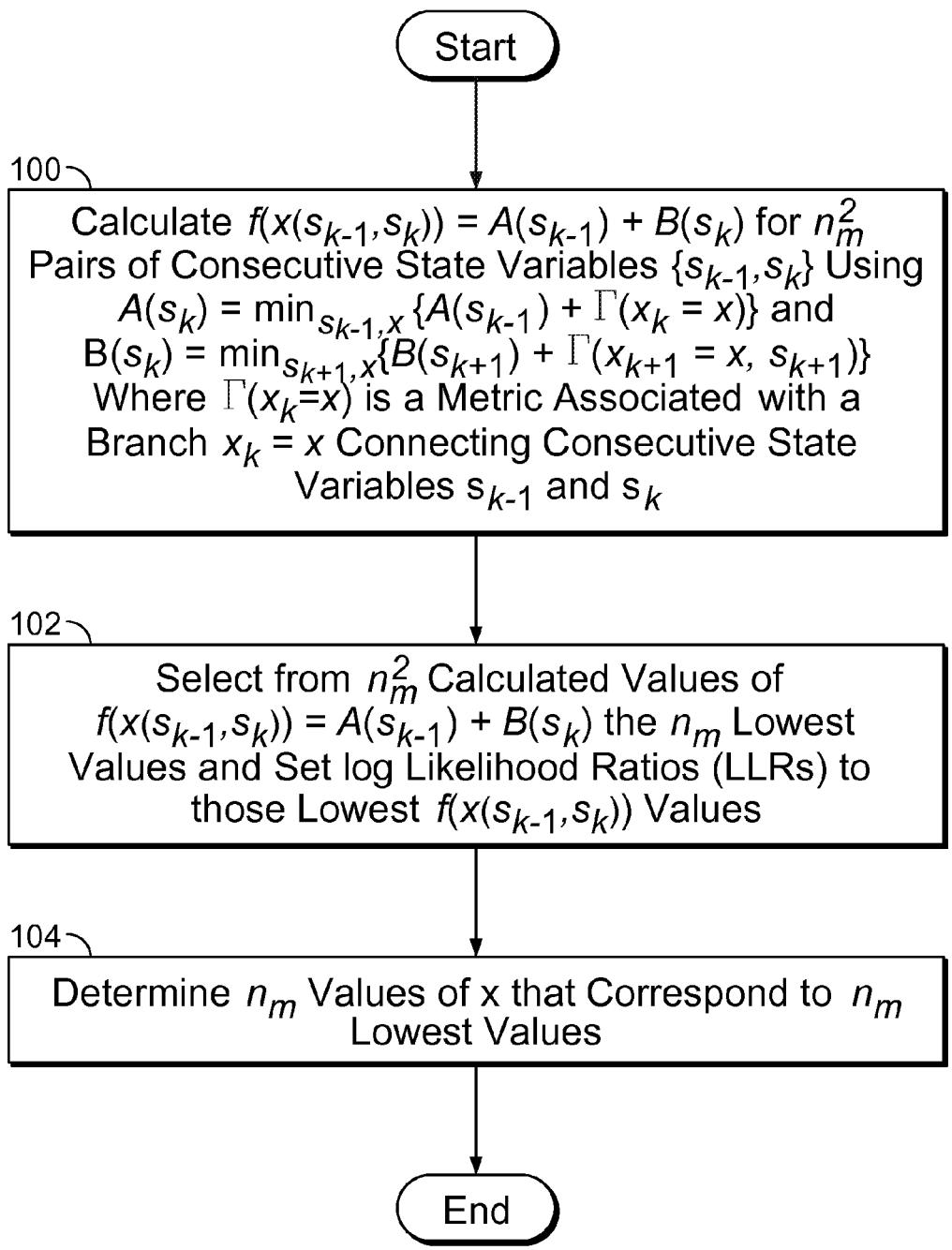
FIG. 1 is a flowchart illustrating an embodiment of check node processing.

FIG. 1 is a flowchart illustrating an embodiment of check node processing. To illustrate the technique, consider the processing involving a single check node. Assume that $d_c$ q-ary symbols, $x_1, x_2, \ldots, x_{d_c}$, are attached to a particular check node. For example, if q=256 then each of the $d_c$ symbols $x_1, x_2, \ldots, x_{d_c}$ can take on one of the 256 levels. Associated with a symbol $x_k$ is a vector of 256 log-likelihood ratios (LLRs): $\ln\{P(x_k=x)/P(x_k=0)\}$, x=0, 1, 2, ..., 255. The LLR vector (LLRV) associated with each symbol can be updated using a forward/backward trellis search, with the trellis structure reflecting the check sum constraint of $\Sigma_{k=1}^{d_c} h_k x_k = 0$, where $h_k$ is the q-ary parity check matrix coefficient corresponding to the k-th symbol position in the given check (the sum and multiplication operations are in GF(q)). Defining a state variable $s_k = \Sigma_{i=1}^{k} h_i x_i = 0$, we can also write $s_k = s_{k-1} + h_k x_k$. This last equation imposes a constraint on allowable transitions in the trellis from $s_{k-1}$ to $s_k$.

A dynamic programming approach can also compute, to a good approximation, the LLRV of $x_k$ by finding the best forward and backward paths that can be connected with a given level of $x_k$ at symbol stage k. Assuming the LLRV is truncated to have only $n_m$ (<q) levels, the trellis has $n_m$ nodes in a given stage with $n_m$ branches coming out of each node. In either the forward or the backward trellis scan, at each symbol stage, $n_m$ distinct LLR values associated with the branches are added to each of $n_m$ LLR values associated with the $n_m$ nodes, giving rise to $n_m^2$ possible levels and corresponding LLR values. At the end of the symbol processing stage, only $n_m$ best distinct nodes and the corresponding accumulated LLR values are kept. Note that the trellis is dynamic in that the set of selected nodes is in general different from one stage to the next. For the truncated system, the LLRs for a symbol are stored in a vector of size $n_m$. Each element in the vector, however, needs to be specified with the corresponding q-ary level. It is convenient to imagine, for example, that each element in the LLR vector now has a wider, say, 13-bit representation, with the first 8 bits indicating the q-ary level and the last 5 bits the corresponding LLR.

At 100, $f(x(s_{k-1}, s_k)) = A(s_{k-1}) + B(s_k)$ is calculated for $n_m^2$ pairs of consecutive state variables $\{s_{k-1}, s_k\}$ using $A(s_k) = \min_{s_{k-1}, x}\{A(s_{k-1}) + \Gamma(x_k=x)\}$ and $B(s_k) \min_{s_{k+1}, x}\{(s_{k+1}) + \Gamma(x_{k+1}=x, s_{k+1})\}$ where $\Gamma(x_k=x)$ is a metric associated with a branch $x_k=x$ connecting consecutive state variables $s_{k-1}$ and $s_k$. This is described in further detail below.

The LLR values for a given symbol $x_k$ are obtained as follows. For each of $n_m$ trellis nodes $s_k \in GF(q)$, a metric $A(s_k)$ is computed:

$$A(s_k) = \min_{s_{k-1}, x}\{A(s_{k-1}) + \Gamma(x_k=x)\}, 1 \leq k \leq d_c - 1 \quad (1)$$

where $\Gamma(x_k=x)$ is the metric associated with a branch $x_k = x \in GF(q)$ connecting the trellis nodes $s_{k-1}$ and $s_k$ (the connection implies a constraint $s_{k-1} + h_x x = s_k$). $s_k$ is referred to as a state variable or a node and may represent an iteration of LDPC processing. Note that $\Gamma(x_k=x)$ is the LLR $\ln\{P(x_k=x)/P(x_k=0))$ obtained in the previous LDPC decoder iteration. Equation (1) depicts forward trellis scanning. The initial node is set to $s_0=0$ with its probability or likelihood measure set to zero, i.e., $A(s_0)=0$. Beyond the initial stage, the $n_m$ values of $s_{k-1}$ and $n_m$ values of $x_k=x$, which all belong to GF(q), may all be different, meaning that finding the best $n_m$ trellis nodes at time k may need to consider up to $n_m^2$ pairs of $\{s_{k-1}, x_k\}$ values. At the last stage, the check node constraint requires that $s_{d_c-1}+h_{d_c}x_{d_c}=0$, which is the same as saying $s_{d_c-1}=0$, i.e., the final trellis node is known and fixed. It is clear that there is no need for the minimization operation for the initial and final stages.

For each node $s_k \in GF(q)$, a second metric $B(s_k)$ is computed:

$$B(s_k)=\min_{s_{k+1},x}\{B(s_{k+1})+\Gamma(x_{k+1}=x,s_{k+1})\}, d_c-1 \leq k \leq 1 \quad (2)$$

where $s_k$ and x are such that $s_{k+1}+h_{k+1}x=s_k$. This represents backward trellis scanning. Again, finding the best $n_m$ nodes at time k may require examination of up to $n_m^2$ pairs of $\{s_{k+1}, x_{k+1}\}$. There is also no need for this minimization at the initial and final trellis stages of the backward scan. In some embodiments, the node metric $B(s_{d_c})$ is set to zero (e.g., arbitrarily).

The LLR values for $x_k=x \in GF(q)$ is then obtained using the stored values of trellis node metrics $$L_k(x)=\min_{s_{k-1},s_k}\{A(s_{k-1})+B(s_k)\} \quad (3)$$

with the minimization taken with a constraint: $s_{k-1}+h_kx+s_k=0$. Equation (3) computes the LLR vector for symbol $x_k$ based on examination of up to $n_m^2$ pairs of forward and backward nodes $\{s_{k-1}, s_k\}$ and selection of up to $n_m$ best pairs (with the connecting branches corresponding to up to $n_m$ distinct levels for $x_k$). This procedure can be stated as first computing $$f(s_{k-1},s_k)=A(s_{k-1})+B(s_k) \quad (3a)$$

for $n_m^2$ pairs of $\{s_{k-1}, s_k\}$. For example, if $n_m=4$ then 16 values of $f(s_{k-1}, s_k)$ would be computed; if $n_m=2$ then 4 values of $f(s_{k-1}, s_k)$ would be computed.

At 102, select from $n_m^2$ calculated values of $f(x(s_{k-1}, s_k))=A(s_{k-1})+B(s_k)$ the $n_m$ lowest values and set log likelihood ratios (LLRs) to those lowest $f(x(s_{k-1}, s_k))$ values. For example, if $n_m^2=16$ then the 4 lowest or minimum values are selected and 4 LLRs are set to those lowest 4 values.

At 104, the $n_m$ values of x that correspond to the $n_m$ lowest values are determined. For example, the $n_m$ q-ary levels are $x_k=h_k^{-1}(s_{k-1}+s_k)$. Each of these levels correspond to one of the LLR values obtained at 102. It is possible that only $n'_m < n_m$ pairs of $\{s_{k-1}, s_k\}$ are connected to each other. In this case, only the $n'_m$ q-ary levels are used to represent the LLRV. The corresponding probability mass (PMF) function is set such that $q-n'_m$ levels for $x_k=x$ are assigned an equal low probability value. In this way the overall probability sum is maintained 1.

In summary, finishing the trellis search based on the steps of (1), (2) and (3) above generates messages (in the form of LLRVs) from a check to all its $d_c$ symbol neighbors. In comparison, for a binary LDPC decoder, this operation is analogous to $d_c$ in-sum operations (each applied to $d_c-1$ members). Let P denote the amount of computation required to process one full symbol stage that involves symbol and LLR additions and selection of nm smallest values out of $n_m^2$ metrics. The overall complexity of the above algorithm can be expressed in terms of P. It requires $(d_c-2) \times P$ computations for either forward scan (1) or backward scan (2) and another $(d_c-2) \times P$ computations for the LLRV computation step (3). The overall complexity is thus $3(d_c-2) \times P$. As for the storage space needed, other than the input $\Gamma(x_k=x)$ and the output $L_k(x)$ LLRV sequences, the algorithm needs to store all $(d_c-2) \times n_m$ node metrics for either the forward scan (A's in Equation 1) or the backward scan (B's in Equation 2).

Figure 2A:
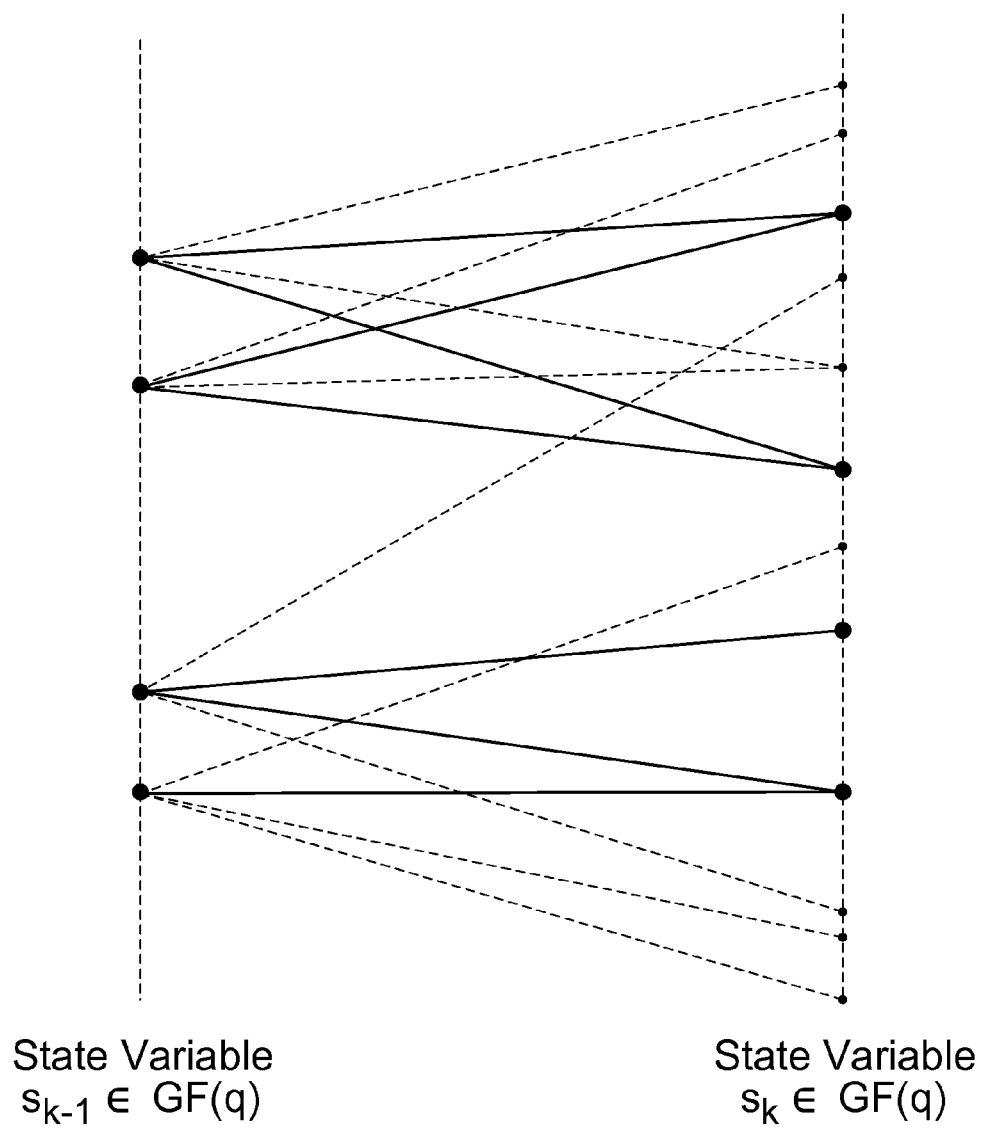
FIG. 2A is a diagram showing an embodiment of processing during a forward scan at a first point in time.

FIG. 2A is a diagram showing an embodiment of processing during a forward scan at a first point in time. In diagram 200, state variable $s_k$ is shown in the right column. In this example, there are 12 distinct nodes shown out of 16 possible nodes (some of which are not shown) on the right side. Of the 12 distinct nodes, the 4 best nodes (at least in this example) are kept. In some other embodiments, some other number of total possible nodes, some other number of distinct nodes, and/or some other number of kept nodes are used.

Figure 2B:
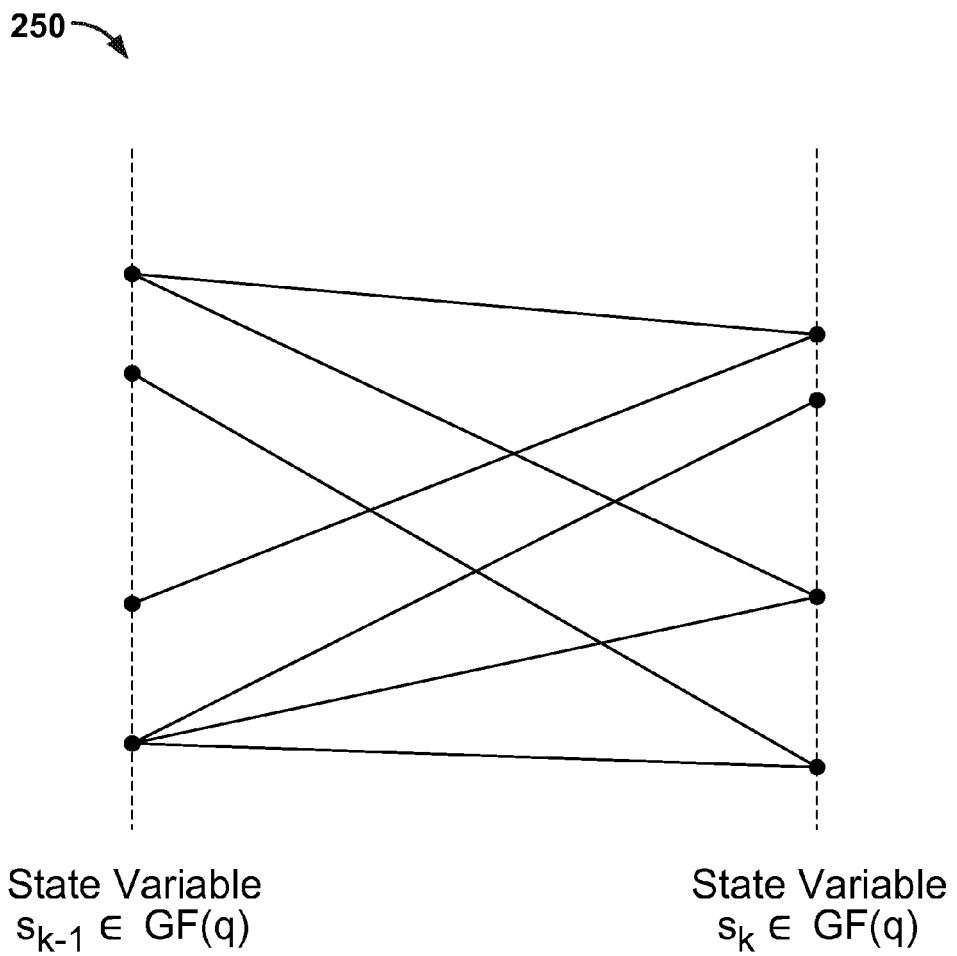
FIG. 2B is a diagram showing an embodiment of processing during a forward scan at a second point in time.

FIG. 2B is a diagram showing an embodiment of processing during a forward scan at a second point in time. In diagram 250, of the 7 $\{s_{k-1}, s_k\}$ connected pairs, the best 4 connected pairs (at least in this example) are selected based on the smallest $f(s_{k-1}, s_k)=A(s_{k-1})+B(s_k)$.

In some embodiments, to reduce complexity and/or memory requirements, the symbols are first rearranged so that each of the first (e.g., 15 symbols) is characterized by one large LLR value (i.e., these symbols are already an LLRV of size $n_m$). In at least some cases, arranging symbols based on the probability distribution improves the complexity/performance tradeoff. Some examples are described in further detail below.

Figure 3:
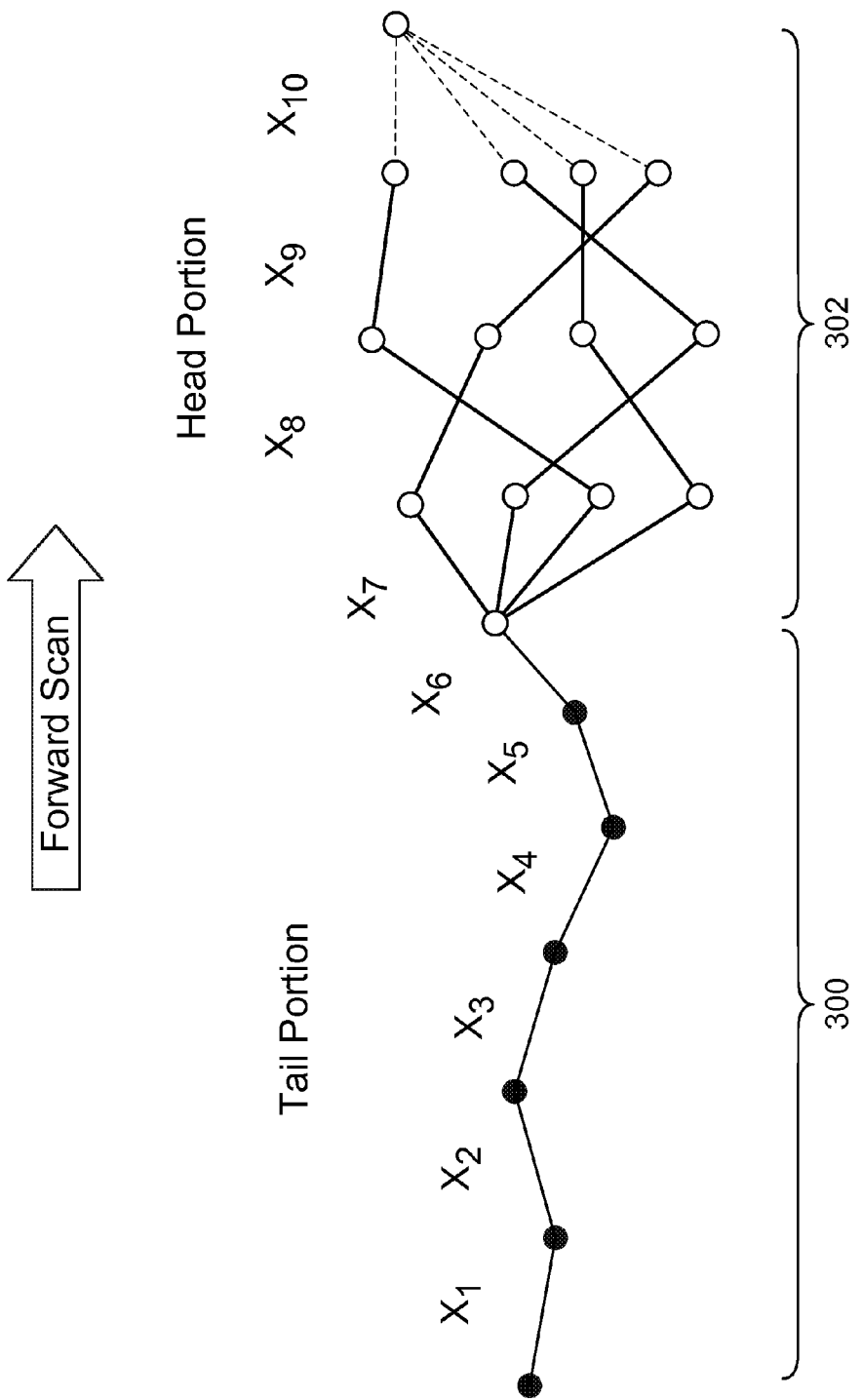
FIG. 3 is a diagram showing an embodiment of a forward trellis where symbols are rearranged.

FIG. 3 is a diagram showing an embodiment of a forward trellis where symbols are rearranged. In the example shown, $d_c=10$ and the survivor paths shown are after a forward scan. Of the 10 symbols, $n_c=4$ symbols are associated with multimode ($n_m=4$) LLR distribution. See, for example, portion 302 of the trellis in FIG. 3. The remaining $d_c-n_c=6$ symbols are associated with a sharp LLR distribution consisting of only one level. See, e.g., portion 300 of the trellis where there is only a single level. The forward trellis has a long tail in the region corresponding to the symbols characterized only by a single q-ary level (i.e., in portion 300). In the region where symbols have four possible levels (i.e., in portion 302), four trellis nodes are kept. Each node maintains one survivor path. A memory space (not shown) stores all node metrics (e.g., As and Bs in the above equations) at each stage. The memory requirement is smaller than some other systems since in the tail region (i.e., 300) as there is only one survivor path.

In some embodiments, the process shown in FIG. 1 further includes constructing a time-varying trellis having a tail portion that reflects truncation of an LLR vector to a single level. Tail portion 300 in FIG. 3 is one example of a tail portion that that reflects truncation of an LLR vector to a single level.

In some embodiments, although there is only one branch shown in tail portion 300 (and thus only one q-ary level specified) in a given stage, a check node processor is configured to generate LLRVs based on $n_m$ levels for all symbols, so that all the branch metrics used in the next iteration of check node processing are expressed using $n_m$ levels. In such embodiments, all $n_m$ survivors are carried along from the head section into the tail during the backward scan. Although these $n_m$ survivors may not necessarily be the best paths to date in the backward scan, they represent reasonably good paths.

For the symbols in the tail region of the forward trellis (i.e., region 300), the forward/backward dynamic programming reduces to a simple version. For forward scan of the tail, one survivor path is maintained by computing:

$$A(s_k)=A(s_{k-1})+\Gamma(x_k), s_{k-1}+h_kx_k=s_k \quad (4)$$

along the path defined by the mostly likely level sequence (for $x_1$ through $x_6$ in FIG. 3). The starting node is set to zero ($s_0=0$) and its metric can arbitrarily be set to zero, i.e., $A(s_0)=0$.

Figure 4:
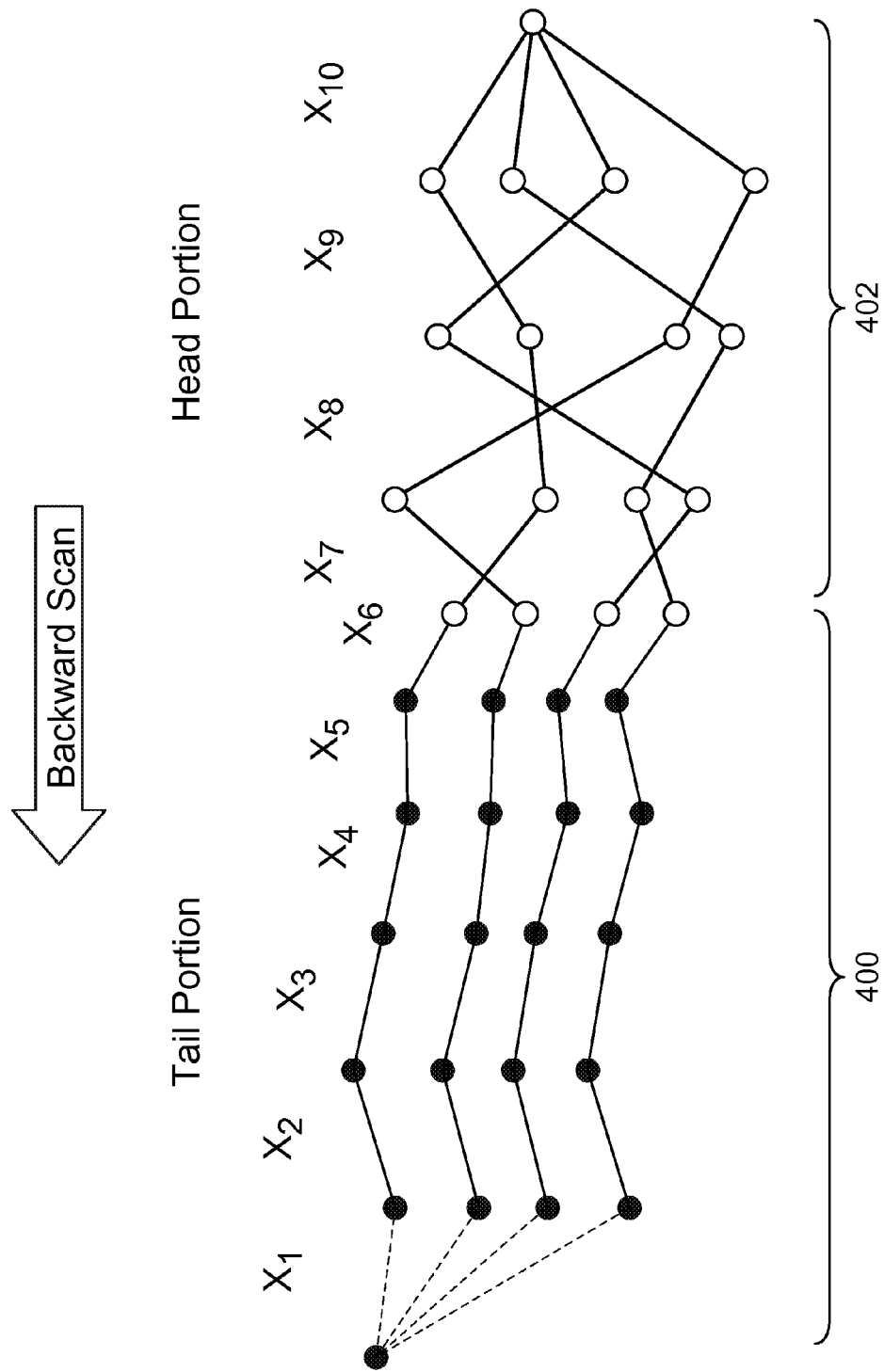
FIG. 4 is a diagram showing an embodiment of a backward trellis that corresponds to the forward trellis shown above.

FIG. 4 is a diagram showing an embodiment of a backward trellis that corresponds to the forward trellis shown above. In the example shown, the trellis includes tail portion 400 and head portion 402. For backward scan of the tail, starting from the $n_m$ distinct states for $s_{k+1}^i$ (the four left-most nodes in FIG. 4 that results from backward path arbitrations carried to this point), $n_m$ paths are simply extended backward, without path arbitration, based on the single known path of the mostly likely levels (for $x_6$ through $x_1$ in FIG. 4):

$$B(s_k^i) = B(s_{k+1}^i) + \Gamma(x_{k+1}), s_{k+1}^i + h_{k+1}x_{k+1} = s_k^i, 1 \le i \le n_m \quad (5)$$

where $s_k^i$ is the i-th node at symbol stage k in the backward scan and $x_{k+1}$ corresponds to the single path in the tail of FIG. 3. The $n_m$ LLR values for $x_k$ in the tail (from k=1 through k=6 in FIGS. 3 and 4) is then obtained as $$L(x(s_{k-1}, s_k^i)) = A(s_{k-1}) + B(s_k^i), 1 \le i \le n_m \quad (6)$$

where $x(s_{k-1}, s_k^i)$, a particular q-ary level for $x_k$, is determined by the pair of consecutive nodes $s_{k-1}$ and $s_k^i$ as $x(s_{k-1}, s_k^i) = h_k^{-1}(s_{k-1} + s_k^i)$. Now that the LLR values for symbols $x_1$ through $x_6$ in FIGS. 3 and 4 have been obtained using Equations (4)-(6), the LLRVs for the rest of the symbols in the head portion of the trellis can be obtained basically applying Equations (1), (2) and (3).

In some embodiments, the process shown in FIG. 1 further includes constructing a time-varying trellis having a tail portion, wherein generation of LLRs for a plurality of symbol levels for a plurality of symbols in the tail portion is based at least in part on extending a same number of survivors from a head portion into the tail portion during a backward scan. In this figure, for example, there are 4 survivor paths that extend from head portion 402 into tail portion 400.

The backward scan depicted in FIG. 4 is implemented in some embodiments but in other embodiments a backwards scan is implemented in some other manner (e.g., the backwards scan described by Equation (2)) while retaining the same forward scan based on FIG. 3. In such embodiments, the technique uses Equation (4) for forward scan, Equation (2) for backward scan, and (6) for LLRV computation. Accordingly, only the complexity of the backward scan becomes higher, while the overall storage requirement also remains the same, relative to the technique with uses Equations (4), (5), and (6). In some applications, the performance improves with the use of (2) in place of (5).

The minimization technique via forward-backward dynamic programming is not optimal in that only one path is considered in computing the message from the check node to a given symbol. In some embodiments to restore some of the performance loss, a scaling factor and/or offset term is used in the computation of the LLRs. In particular, the LLR value obtained above can be modified with:

$$L_k(x) \leftarrow \max\{\alpha L_k(x) - \beta, 0\}$$

where $\alpha$ is a scaling constant between 0 and 1, and $\beta$ is a positive offset. The constants $\alpha$ and $\beta$ can be determined empirically and may be allowed to change from one iteration stage to the next.

The complexity level of the proposed scheme based on Equations (4)-(6) is dominated by $(n_c-2) \times P$ computations for forward scan, $(n_c-1) \times P$ computations for backward scan, and $(n_c-2) \times P$ computations for the LLRV computation step, all for the head portion of the trellis. Letting $n_c = \gamma d_c$ so $\gamma$ represents the portion of the symbols that retain $n_m$-level PMFs, the complexity savings relative to uniform level PMFs is given by $$\frac{3(d_c-2)P - [2(n_c-2)P + (n_c-1)p]}{3(d_c-2)P} =$$

$$\frac{3(d_c-2) - 3(n_c-2) - 1}{3(d_c-2)} \approx \frac{(d_c-2) - (\gamma d_c - 2)}{(d_c-2)} = \frac{d_c - \gamma d_c}{d_c - 2} \approx 1 - \gamma$$

So if $\gamma = 0.4$, for example, the complexity is reduced to 40%.

The storage space is again dominated by the head section, requiring roughly $(n_c-2) \times n_m$ node metrics to be stored during forward scan. The complexity savings relative to the forward-backward trellis search with the uniform PMF truncation level $n_m$ is thus $$\frac{(d_c-2)n_m - (n_c-2)n_m}{(d_c-2)n_m} = \frac{d_c - \gamma d_c}{D_c - 2} \approx 1 - \gamma$$

which is the same as the relative complexity savings.

Let us now take a closer look at the computational requirement associated with P. A straightforward way to do processing for one full symbol stage is basically adding $n_m$ different branch values to each of $n_m$ distinct node values (path metrics updated in the previous stage) and then finding $n_m$ survivor paths out of $n_m^2$ candidates for the $n_m$ distinct nodes. The set of nodes changes dynamically from one stage to next; so hardware implementation is different from the case of the Viterbi algorithm operating on a fixed trellis structure with $n_m$ states and $n_m$ branches out of (and into) each state. Some techniques can roughly accomplish this task in $2n_m \log_2 n_m$ max operations (the max operation compares two values and selects the larger) and the same number of q-ary symbol additions as well as LLR additions.

In order to use the technique above which requires $2n_m \log_2 n_m$ max operations in carrying out P, sorting is needed for each symbol's LLR values as well, which requires $\log_2 n_m$ operations per symbol. In some embodiments, to accommodate this, symbols are rearranged into the tail and head sections of the trellis. This requires looking (for example) at the difference in the highest and second highest LLR values for every symbol and then selecting $n_c$ symbols with least differences to form the head section of the trellis. It is also possible to look at the cumulative probability of a few most likely levels in determining the number of levels that account for the most of the probability mass. This would be a relatively low-complexity operation.

The idea of truncating the LLR vector to just one level for a number of symbols can be extended to a general case where different subsets of symbols undergo different levels of LLR vector truncation. In some embodiments, the process shown in FIG. 1 further includes constructing a time-varying trellis that reflects a truncation strategy where different subsets of symbols undergo different levels of LLR vector truncation. For example, one group of symbols for a LLR vector are truncated to a single level whereas another group of symbols is truncated or otherwise reduced to two levels.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A method, comprising:
   using a processor to perform low density party check (LDPC) decoding in order to obtain LDPC decoded data, including by:
      using the processor to calculate, for each of $n_m^2$ pairs of consecutive state variables $\{s_{k-1}, s_k\}$, a value that is based at least in part on (1) a first metric associated with a forward scan for a given pair of consecutive state variables and (2) a second metric associated with a backward scan for the given pair of consecutive state variables, where $n_m$ is an integer and $n_m^2$ is the square of that integer;
      using the processor to select, from the $n_m^2$ calculated values, the $n_m$ lowest values;

setting log likelihood ratios (LLRs) to those lowest values;

using the processor to determine $n_m$ q-ary levels that correspond to the $n_m$ lowest values; and rearranging symbols in a trellis to create a head portion of the trellis and a tail portion of the trellis, including by:

for every symbol in the trellis, obtaining a difference between a highest LLR and a second highest LLR; and assigning, to the head portion, those symbols that have the least differences between the highest LLR and the second highest LLR; and outputting the LDPC decoded data.

2. The method of claim 1 further comprising processing the trellis during the forward scan of the trellis so that the tail portion has a single survivor path.

3. The method of claim 2 further comprising modifying the tail portion, during the backward scan, so that a same number of survivor paths from the head portion is extended into the tail portion.

4. The method of claim 1, wherein rearranging symbols further includes: assigning, to the tail portion, those symbols that are characterized by one large LLR.

5. The method of claim 1 further comprising processing the trellis, including by:

reducing the head portion of the trellis to a first number of survivor paths; and reducing the tail portion of the trellis to a second number of survivor paths different from the first number of survivor paths.

6. A system, comprising:

a metric calculator configured to calculate, for $n_m^2$ pairs of consecutive state variables $\{s_{k-1}, s_k\}$, a value that is based at least in part on (1) a first metric associated with a forward scan for a given pair of consecutive state variables and (2) a second metric associated with a backward scan for the given pair of consecutive state variables, where $n_m$ is an integer and $n_m^2$ is the square of that integer;

a selector configured to select, from the $n_m^2$ calculated values, the $n_m$ lowest values and set log likelihood ratios (LLRs) to those lowest values; and a processor configured to:

determine $n_m$ q-ary levels that correspond to the $n_m$ lowest values; and rearrange symbols in a trellis to create a head portion of the trellis and a tail portion of the trellis, including by:

for every symbol in the trellis, obtaining a difference between a highest LLR and a second highest LLR; and assigning, to the head portion, those symbols that have the least differences between the highest LLR and the second highest LLR.

7. The system of claim 6, wherein the processor is further configured to process the trellis during the forward scan of the trellis so that the tail portion has a single survivor path.

8. The system of claim 7, wherein the processor is further configured to: modify the tail portion, during the backward scan, so that a same number of survivor paths from the head portion is extended into the tail portion.

9. The system of claim 6 wherein the processor is configured to rearrange symbols including by: assigning, to the tail portion, those symbols that are characterized by one large LLR.

10. The system of claim 6, wherein the processor is further configured to process the trellis, including by:

reducing the head portion of the trellis to a first number of survivor paths; and reducing the tail portion of the trellis to a second number of survivor paths different from the first number of survivor paths.

11. A computer program product, the computer program product being embodied in a non-transitory computer readable storage medium and comprising computer instructions for:

calculating, for $n_m^2$ pairs of consecutive state variables $\{s_{k-1}, s_k\}$, a value that is based at least in part on (1) a first metric associated with a forward scan for a given pair of consecutive state variables and (2) a second metric associated with a backward scan for the given pair of consecutive state variables, where $n_m$ is an integer and $n_m^2$ is the square of that integer;

selecting, from the $n_m^2$ calculated values, the $n_m$ lowest values;

setting log likelihood ratios (LLRs) to those lowest values;

determining $n_m$ q-ary levels that correspond to the $n_m$ lowest value; and rearranging symbols in a trellis to create a head portion of the trellis and a tail portion of the trellis, including by:

for every symbol in the trellis, obtaining a difference between a highest LLR and a second highest LLR; and assigning, to the head portion, those symbols that have the least differences between the highest LLR and the second highest LLR.

12. The computer program product of claim 11 further comprising computer instructions for processing the trellis during the forward scan of the trellis so that the tail portion has a single survivor path.

13. The computer program product of claim 12 further comprising computer instructions for modifying the tail portion, during the backward scan, so that a same number of survivor paths from the head portion is extended into the tail portion.

14. The computer program product of claim 11, wherein the computer instructions for rearranging symbols further include computer instructions for assigning, to the tail portion, those symbols that are characterized by one large LLR.

15. The computer program product of claim 11 further comprising computer instructions for processing the trellis, including by:

reducing the head portion of the trellis to a first number of survivor paths; and reducing the tail portion of the trellis to a second number of survivor paths different from the first number of survivor paths.

* * * * *